United States Patent
Tian et al.

(10) Patent No.: US 10,014,272 B2
(45) Date of Patent: Jul. 3, 2018

(54) DIE BONDING WITH LIQUID PHASE SOLDER

(71) Applicant: ASM Technology Singapore Pte Ltd, Singapore (SG)

(72) Inventors: Dewen Tian, Kwai Chung (HK); Yiu Ming Cheung, Kowloon (HK); Ming Li, Kwai Chung (HK)

(73) Assignee: ASM TECHNOLOGY SINGAPORE PTE LTD, Singapore (SG)

(*) Notice: Subject to any disclaimer, the term of this patent is extended or adjusted under 35 U.S.C. 154(b) by 116 days.

(21) Appl. No.: 14/708,375

(22) Filed: May 11, 2015

(65) Prior Publication Data

US 2016/0336292 A1 Nov. 17, 2016

(51) Int. Cl.
*H01L 23/00* (2006.01)

(52) U.S. Cl.
CPC .............. *H01L 24/81* (2013.01); *H01L 24/75* (2013.01); *H01L 2224/131* (2013.01); *H01L 2224/16237* (2013.01); *H01L 2224/751* (2013.01); *H01L 2224/7525* (2013.01); *H01L 2224/75745* (2013.01); *H01L 2224/75753* (2013.01); *H01L 2224/75841* (2013.01); *H01L 2224/8113* (2013.01); *H01L 2224/8118* (2013.01); *H01L 2224/81022* (2013.01); *H01L 2224/81024* (2013.01); *H01L 2224/81048* (2013.01); *H01L 2224/81075* (2013.01); *H01L 2224/81095* (2013.01); *H01L 2224/81132* (2013.01); *H01L 2224/81191* (2013.01); *H01L 2224/81444* (2013.01); *H01L 2224/81815* (2013.01)

(58) Field of Classification Search
None
See application file for complete search history.

(56) References Cited

U.S. PATENT DOCUMENTS

| | | | | |
|---|---|---|---|---|
| 2011/0287560 A1* | 11/2011 | Chew | ................... | B23K 1/0016 438/15 |
| 2012/0111922 A1* | 5/2012 | Hwang | ................ | B23K 1/0012 228/6.2 |
| 2012/0217287 A1* | 8/2012 | Kumar | ................. | B23K 1/0016 228/178 |
| 2013/0270230 A1* | 10/2013 | Cheung | ................... | H01L 24/75 219/121.6 |
| 2014/0154037 A1* | 6/2014 | Sen | ................... | H01L 21/67144 414/744.2 |
| 2014/0175159 A1* | 6/2014 | Kostner | ................. | H01L 24/81 228/102 |

(Continued)

*Primary Examiner* — Devang R Patel
(74) *Attorney, Agent, or Firm* — Ostrolenk Faber LLP

(57) ABSTRACT

A method of bonding a die comprising solder bumps to a substrate comprising bond pads, the method comprising the steps of heating the die from a first temperature to a second temperature, wherein the first temperature is below the melting point of the solder bumps, and the second temperature is above the melting point of the solder bumps; moving the die relative to the substrate to a first height, whereat the solder bumps contact the bond pads; moving the die further away from the substrate to a second height, while maintaining contact between the solder bumps and bond pads; and thereafter cooling the die from the second temperature to a third temperature to allow the solder bumps to solidify so as to bond the die to the substrate.

17 Claims, 6 Drawing Sheets

(56) References Cited

U.S. PATENT DOCUMENTS

2015/0048523 A1\* 2/2015 Suga ..................... H01L 24/74
  257/777
2015/0087083 A1\* 3/2015 Tani ..................... H01L 24/75
  438/5

\* cited by examiner

DIE BONDING WITH LIQUID PHASE SOLDER

FIELD OF THE INVENTION

The invention relates to chip bonding, for example the bonding of a chip or die to a substrate or wafer during the assembly of electronic devices, and in particular to flip-chip bonding.

BACKGROUND

Assembly of an integrated circuit (IC) for electronic package involves attachment of a die or chip to a substrate, such as a Bismaleimide-Triazine (BT) substrate or a silicon wafer, either with the chip facing up or down.

Wire bonding is a face-up bonding technique that uses electrically conducting wires to connect from Input/Output (I/Os) or electrodes of the chip to corresponding bond pads on the substrate or a bottom chip in an electronic package. The attachment of face-up chip is done by gluing the chip onto the substrate or the bottom chip by epoxy, and the connecting wires may be thin gold, copper, or aluminum wires.

Flip-chip bonding process is a face-down bonding technique where interconnections between electrodes of the chip, such as a flip-chip IC, and the bond pads of the substrate or the bottom chip are realized using bumps, such as balls, micro-bumps, or solder capped copper pillars, of electrically conducting material. The bumps are deposited over the electrodes of the flip-chip IC, which may be located at a periphery of the flip-chip IC, and were originally used for wire bonding interconnects. If the pitch of the electrodes is small, a redistribution layer may be needed to redistribute the electrodes from the periphery of the flip-chip IC to an area array across the surface of the flip-chip IC. In some high density I/O flip-chip IC, thousands of electrodes may be arranged in a combination of peripheral and array area or full area configuration.

Controlled collapse chip connection (C4) flip-chip process utilizes an oven to reflow the bumps on a chip which is accurately placed onto the substrate, thus realizing the flip-chip interconnections bonding process. If there are a large number of I/Os and the pitch is small, solder capped copper pillars are used, instead of micro-bumps which may be more susceptible to bridging failure during reflow. The reduction of the solder volume in the solder cap of the copper pillars may minimize the chances of solder bridging during solder reflow for fine pitch and high density I/O flip-chip IC. For example, the solder capped copper pillars may have diameters as small as 30 µm, and heights as small as 40 µm (comprising of 25 µm high copper pillar and 15 µm high solder cap). Nevertheless, after the flip-chip bonding process, it is preferred that the solder capped copper pillars have a high enough stand-off height for a subsequent underfilling process.

However, as the amount of solder in the solder capped copper pillars is reduced, some problems may be encountered when utilizing the oven reflow process using an ordinary reflow oven. For example, the advantage of self-alignment of solder joints in a solder reflow process would no longer exist, when there is too small an amount of solder in the solder capped copper pillar. A more accurate flip-chip bonding machine, for example having placement accuracy better than 2 µm to 3 µm, may be required to place the chip onto the substrate. Other solder joints related failures such as open and cold joints may be present due to the following reasons: (i) there may be uncontrollable die tilt since there is no compression force acting on the chip during the reflow process in the reflow oven; (ii) the chip may shift out of position due to vibration of a convey belt in the reflow oven; (iii) there may be height variation (for example up to 2 µm) between the different bond pads of substrate; and (iv) there may be excessive substrate warpage when the substrate is heated up to a high temperature in the reflow oven. In addition, poorer bonding material quality may also reduce the yield of the oven reflow process. It may be due to the fact that: (i) there may be height variation of up to 2 µm to 3 µm between the different solder capped copper pillars on the chip, and (ii) there may be volume inconsistency between the different solder caps on the solder capped copper pillars of the chip.

In some flip-chip bonding processes for thin dice, such as memory packages, a thin silicon chip, for example of thickness less than 50 µm, may exhibit substantial warpage even when it is free standing, which is caused by residual stress after a wafer thinning process. The oven reflow process using the ordinary reflow oven may not be suitable for fine pitch flip-chip bonding processes, because the process yield may be low.

Thermal compression bonding (TCB) process may be used for the flip-chip bonding process for the solder capped copper pillars with a small amount of solder. The TCB process is not a batch process unlike the oven reflow process. The TCB of the flip-chip IC is performed one chip at a time. The chip from the silicon wafer is flipped and transferred to a bond-arm with the bumps facing down. The chip is carried by a collet of the bond-arm, and the chip is dipped into a flux plate filled with a layer of flux for flux wetting of the bumps. The temperature of the bond-arm holding the chip should be at a low temperature, for example below 60° C., because most fluxes evaporate rapidly close to or above 80° C. The flux is used, because the flux helps to remove oxides on the surfaces of the bond pads and the solder caps, during bonding.

The chip is then aligned by an optical alignment module comprising an up-looking camera and a down-looking camera. The down-looking camera is used to align the substrate or the bottom chip. The chip is placed on a bonding location of the substrate or the bottom chip. A small compressive normal force is applied to the chip pressing it against the substrate or the bottom chip to ensure good contact between the solder capped copper pillars and the corresponding bond pads.

The bond-arm is heated up, to for example above 260° C., to bond the copper pillars to the bond pads of the substrate or the bottom chip. It is important to use an appropriate heater temperature profile for the bond-arm, to ensure solder joints are properly formed. Thereafter, the bond-arm cools down so that the solder solidifies and forms a joint, then the bond-arm releases the chip which is bonded to the substrate. The bond-arm rises to a stand-by position, and the bond-arm has to cool down to a temperature of less than 60° C. for the flux dipping of another chip for a next bonding cycle. Since cooling the bond-arm from above 260° C. to around 60° C. takes some time (for example more than 5 seconds), the overall cycle time for the TCB process will be time consuming. The flux dipping process is a bottleneck of the TCB process since the bond-arm has to cool down to a low temperature, for example below 60° C., to prevent rapid evaporation of the flux on the solder capped copper pillars.

It would be beneficial to increase the speed and accuracy of the bonding process as compared to the prior art.

SUMMARY OF THE INVENTION

It is thus an object of this invention to seek to provide a die bonding process which overcomes at least some of the aforementioned problems of the prior art.

According to a first aspect of the present invention, there is provided a method of bonding a die comprising solder bumps to a substrate comprising bond pads, the method comprising the steps of:

heating the die from a first temperature to a second temperature, wherein the first temperature is below the melting point of the solder bumps, and the second temperature is above the melting point of the solder bumps;

moving the die relative to the substrate to a first height, whereat the solder bumps contact the bond pads;

moving the die further away from the substrate to a second height, while maintaining contact between the solder bumps and bond pads; and thereafter cooling the die from the second temperature to a third temperature to allow the solder bumps to solidify so as to bond the die to the substrate.

According to a second aspect of the present invention, there is provided a die bonder configured to perform the method according to the first aspect of the present invention.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
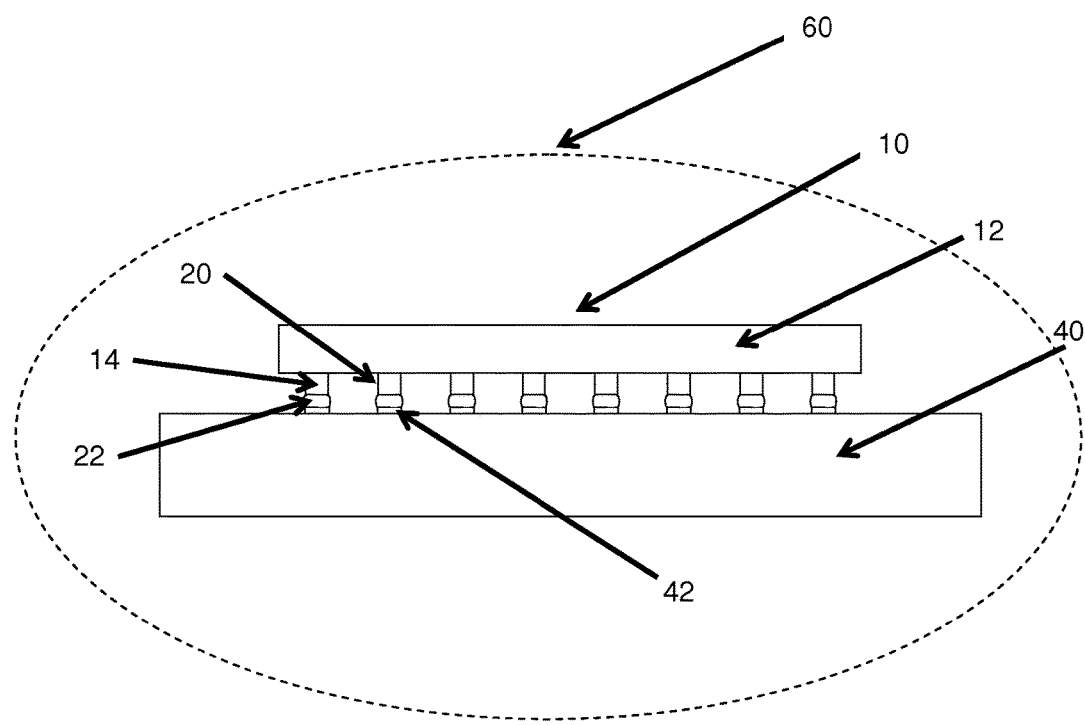
FIG. 1 shows device comprising a chip bonded to a substrate.

FIG. 1 shows a device 10 comprising a chip or die 12, such as a semiconductor chip or a flip-chip IC, bonded to a substrate 40, such as a silicon wafer, a bottom chip, or a BT substrate. The chip 12 comprises a plurality of solder bumps or bumps 20 attached to a first side of the chip 12, each bump 20 comprising a respective pillar, for example a copper pillar 14. The substrate 40 comprises a plurality of bond pads 42. Each copper pillar 14 is bonded to a respective bond pad 42 by a corresponding solder joint 22. One example of the device 10 is a chip-on-substrate (COS) comprising a flip-chip IC 12 bonded to a BT substrate 40, and is found in electronic packages such as BGA, micro-BGA, and chip scale packages (CSP). Another example of the device 10 is a chip-on-wafer (COW) comprising a flip-chip IC 12 bonded to a silicon wafer 40. The device 10 is manufactured or fabricated in an inert environment, inert gas environment, inert zone, or inert area 60, where the oxygen level is below 50 ppm (parts per million). The inert environment 60 can be created by actively introducing, filling, or purging the inert environment 60 with nitrogen N2 gas, or some other inert gases. One advantage of performing the bonding process of bonding the chip 12 to the substrate 40 in the inert environment 60, is that the oxidization and/or re-oxidation of bonding surfaces, metallic surfaces, and solder surfaces is prevented or substantially reduced, which is especially advantageous because of the high process temperature during the bonding process. Another advantage of performing the bonding process of bonding the chip 12 to the substrate 40 in the inert environment 60, is that the inert gas in the inert environment 60 promotes the wetting of solder on the bonding surfaces or metallic surfaces.

Figure 2:
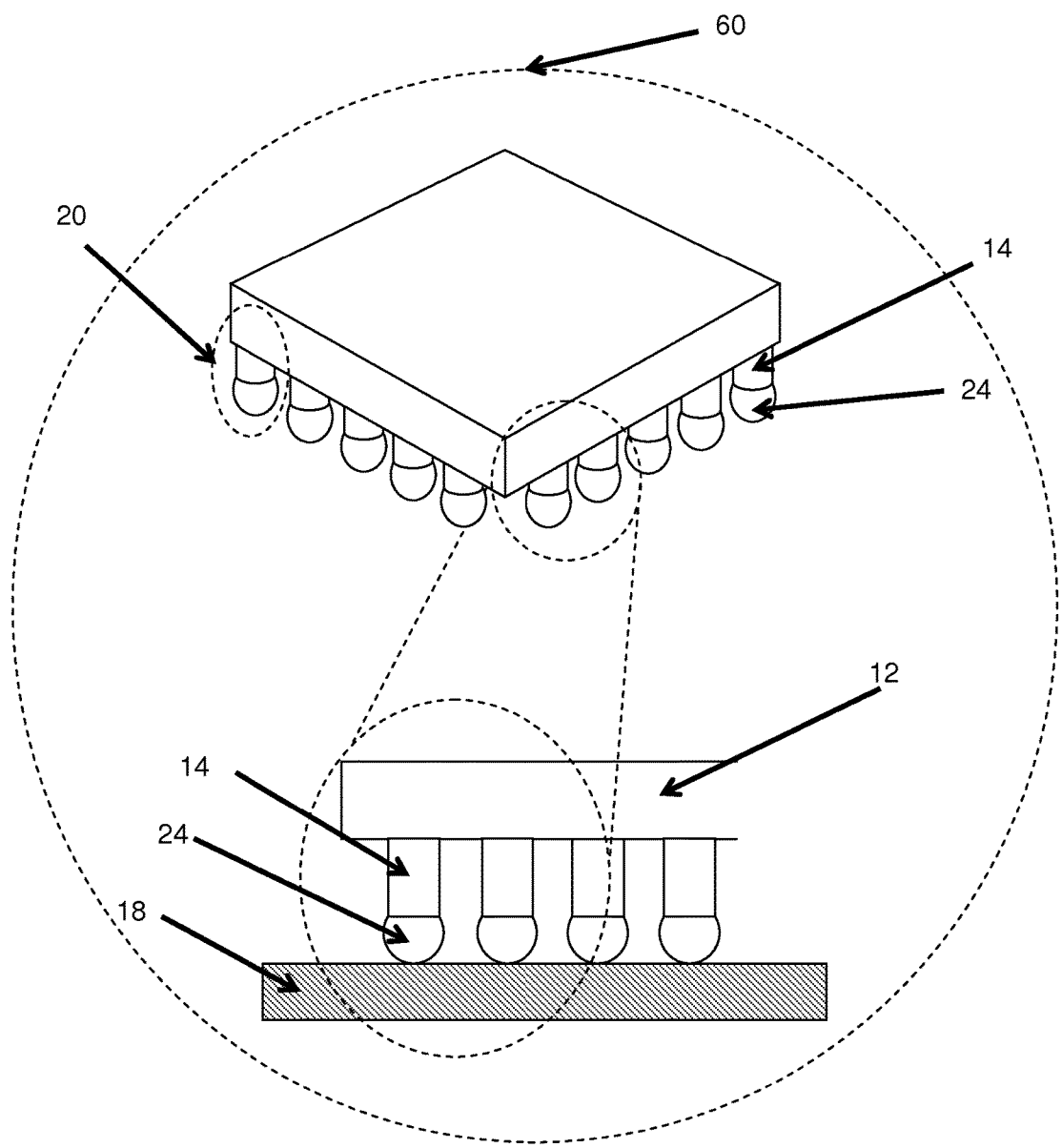
FIG. 2 shows the chip on a preheat stage.

FIG. 2 shows the chip 12 on a preheat stage 18. The chip 12 comprises the plurality of bumps 20, where each of the bumps 20 comprises a respective unbonded solder cap 24 attached to or located at one end of the corresponding pillar 14 remote the chip 12. Each pillar 14 comprises a substantially cylindrical shape, although other shapes are possible. The cylindrical diameter of the pillars 14, and therefore also the bumps 20, may vary widely, but is generally about 20 μm to 60 μm. The height of the unbonded solder cap 24 may vary widely, but is generally approximately half of the diameter of the pillar 14, about 10 μm to 30 μm, such that the volume of solder in the unbonded solder cap 24 would be about ½₀₀₀ to ⅟₆₀ of the volume of solder in a 100 μm diameter solder ball.

The first side of the chip 12 with the bumps 20 attached is facing the preheat stage 18, such that the chip 12 is resting on the preheat stage 18 with the unbonded solder cap 24 contacting the preheat stage 18. The preheat stage 18 preheats the chip 12 to a first temperature, which is below the melting point of the solder comprised in the unbonded solder cap 24. The first temperature is a temperature close to the melting point of the solder comprised in the unbonded solder cap 24, for example 20° C. to 30° C. below the melting point of the solder comprised in the unbonded solder cap 24. Therefore the unbonded solder cap 24 is still in the solid state. An advantage of heating the chip 12 on the preheat stage 18 is that the time taken in a subsequent heating step to melt the unbonded solder cap 24 is reduced, and therefore the throughput is improved. The preheat stage 18 moves the chip 12 to a location below a bond-arm (not shown) comprising a collet 30. The bond-arm moves down to pick up the chip 12 with the collet 30, and the preheat stage 18 moves away from the location below the bond-arm after the collet 30 picks up the chip 12. Then the substrate 40 is moved to the location below the bond-arm.

Figure 3:
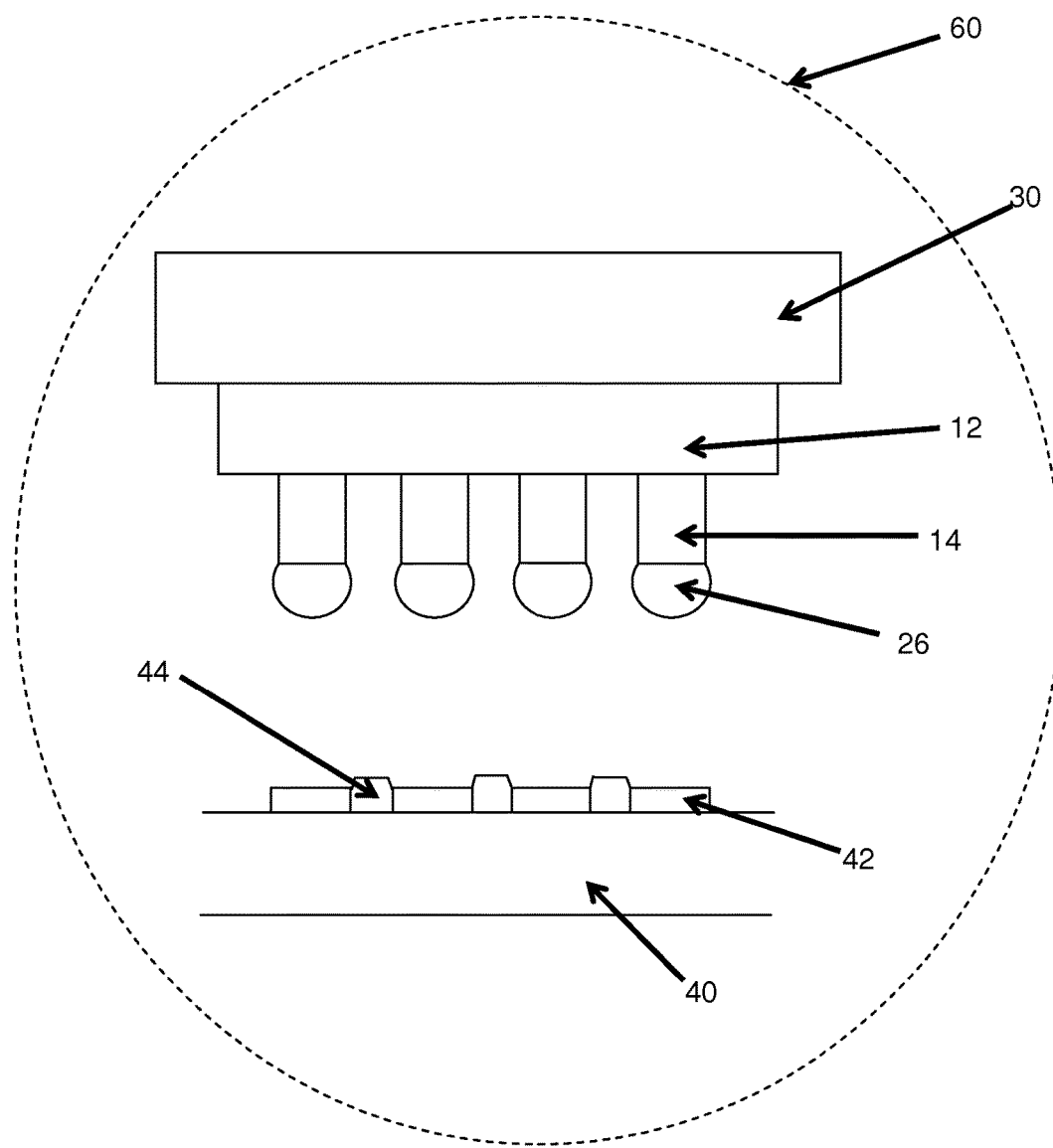
FIG. 3 shows a collet holding the chip above the substrate.

FIG. 3 shows the collet 30 holding the chip 12 above the substrate 40. The collet 30 contacts and holds by vacuum suction the chip 12 by a second side of the chip 12, which is opposite the first side of the chip 12. One advantage of using vacuum suction to hold the chip 12 is that the vacuum suction can help to flatten the chip 12 onto the surface of the collet 30. This is especially advantageous when the collet 30 is picking a thin (less than 50 μm thick) chip 12, which would warp even on free standing. The first side of the chip 12 is facing downwards towards the substrate 40.

The bond-arm further comprises a bond-arm heater (not shown) for heating the chip 12 to a second temperature, which is above the melting point of the solder comprised in the unbonded solder cap 24, until the unbonded solder cap 24 melts to become a molten solder cap 26. The second temperature may vary widely, but is usually 20° C. to 30° C. above the melting point of the solder comprised in the unbonded solder cap 24. The molten solder cap 26 may be heated until all the solder comprised in the molten solder cap 26 has melted to molten form or liquid phase, or until most of the solder comprised in the molten solder cap 26 has melted to molten form or liquid phase. An advantage of melting the unbonded solder cap 24 before the contacting the bond pad 42 of the substrate 40, is that the effect of variations in the thickness of the unbonded solder cap 24 when the molten solder cap 26 moves down to contact the bond pad 42, may be minimized. Therefore, a more reliable and consistent standoff height control can be achieved. Another advantage of melting the unbonded solder cap 24 before the molten solder cap 26 contacts the bond pad 42 of the substrate 40 is that molten solder is easy to deform, which allows the use of a low contact force to cause the pillar 14 to contact the bond pad 42.

The substrate 40 is located on a bond stage (not shown), where it is preheated to an elevated temperature, which may be about 150° C. If the substrate 40 is a BT substrate, the BT substrate would become soft at the elevated temperature, such that the BT substrate is flattened when the bond stage uses vacuum suction to hold the substrate 40. If the substrate 40 is a silicon wafer, the elevated temperature of the bond stage would help to reduce heat loss through the substrate 40 and the bond stage during the bonding process.

The substrate 40 comprises the plurality of bond pads 42, and a plurality of solder masks or passivation structures 44, where each solder mask 44 is disposed between two respective bond pads 42. The solder masks 44 help prevent the molten solder cap 26 from bridging to an adjacent bond pad 42 when the molten solder cap 26 is deformed and squeezed out when the plurality of copper pillars 14 contact the plurality of bond pads 42. Flux (not shown) may be applied to the plurality of bond pads 42, for example by flux printing or spraying. An advantage of using the flux is that the flux reduces the surface tension of the solder as well as removes the oxides on the bond pad 42. Optionally, by performing the die bonding process of bonding the chip 12 to the substrate 40 in the inert environment 60, flux may be not necessary (flux-less bonding process), because the inert environment 60 prevents oxidation of the bond pad 42.

Figures 4A, 4B, 4C:
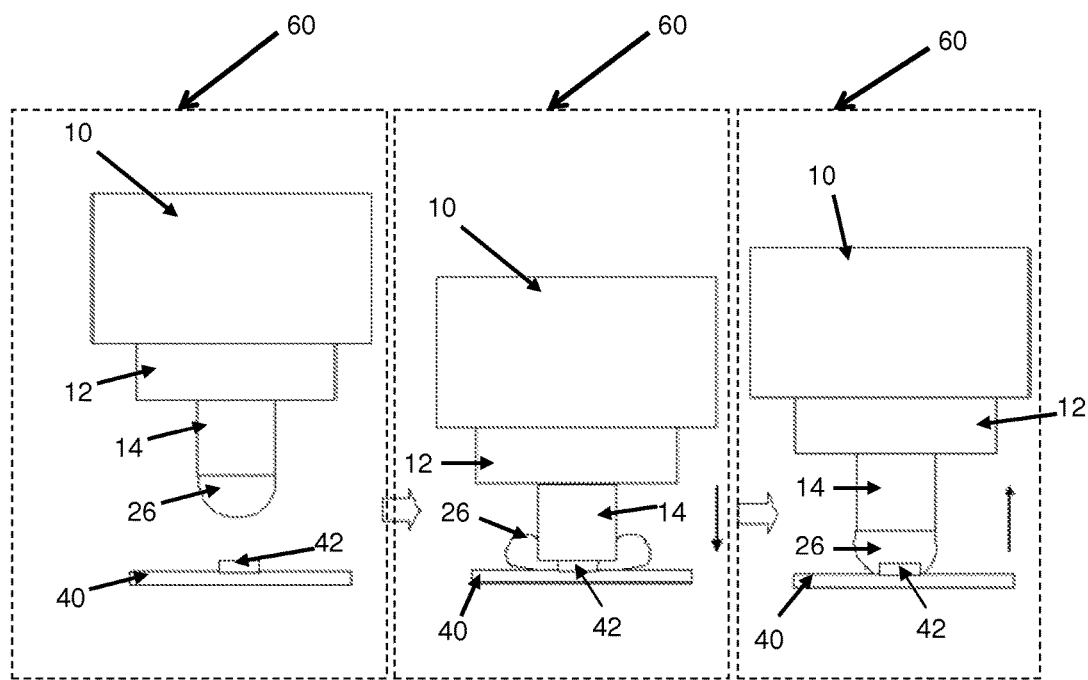
FIG. 4A shows the substrate accurately aligned below the chip such that a pillar is above a bond pad.
FIG. 4B shows the pillar of the chip contacting the bond pad of the substrate.
FIG. 4C shows the chip at a predetermined stand-off height above the substrate.

FIG. 4A shows the substrate 40 accurately aligned below the chip 12 such that the pillar 14 is above the bond bad 42. An optical alignment module (not shown) comprising up-looking optics (not shown) and/or down-looking optics (not shown) helps align the chip 12 and the substrate 40, by identifying the locations of alignment fiducials or distinct features (not shown) on the chip 12 and alignment fiducials or distinct features (not shown) on the substrate 40. The bond stage moves and adjust its position and orientation, so as to align the pillar 14 or the molten solder cap 26 vertically above the bond pad 42. The positioning accuracy between the chip 12 and the substrate 40 may be kept to within 2 μm to 3 μm. One advantage of performing alignment after heating the chip 12 and the substrate 40 is that better alignment and placement accuracy may be achieved because substantial positional shifts due to thermal expansion if the chip 12 and/or the substrate 40 are heated from room temperature are avoided.

The first side of the chip 12 is facing downwards towards the substrate 40, with the pillars 14 extending downwards towards the bond pads 42 of the substrate 40. The inert environment 60 prevents oxidization of the bond pad 42 and further oxidization of the molten solder cap 26, which is especially advantageous for a flux-less bonding process. The bond-arm moves downwards from a stand-by position or level, towards the substrate 40. The chip 12 is maintained at about the second temperature such that the molten solder cap 26 is maintained in molten form or liquid phase. The bond-arm moves the chip 12 relative to the substrate 40, downwards towards the substrate, at two speeds. Initially, the bond-arm moves downwards at a relatively high speed from the stand-by level until the bond-arm reaches a predetermined contact detecting level or position, which may be where the chip 12 is approximately 300 μm to 500 μm above the surface of the substrate 40 or the bond pad 42. Subsequently, from the predetermined contact detecting level, the bond-arm moves downwards at a relatively slow speed, in order to search for contact between the pillar 14 and the bond pad 42, until the pillar 14 contacts the bond pad 42. When the molten solder cap 26, which is in liquid phase, contacts a surface of the bond pad 42, the contact reaction force is small and generally not detectable. The bond-arm continues to move further downwards until the copper pillar 14 contacts the surface of the bond pad 42. When the pillars 14 contact the bond pads 42, the contact reaction force is sufficient to be detectable.

FIG. 4B shows the pillar 14 of the chip 12 contacting the bond pad 42 of the substrate 40. The bond-arm stops moving downwards at a first height, when the contact between the pillar 14 and the bond pad 42 is detected. The pillar 14 exerts a contact force on the bond pad 42, when the bond pad 42 is contacted by the pillar 14. At a high temperature, the substrate 40 may be deformed if the contact force is too large. By slowing down the bond-arm when searching for contact, a lower contact force may be used to avoid deformation of the substrate 40. The molten solder cap 26, which is in liquid phase, is deformed or squeezed out around the copper pillar 14, when the pillar 14 contacts the bond pad 42. When the bond-arm stops at the first height and the pillar 14 contacts the bond pad 42, the deformation or squeezing out of the molten solder cap 26 helps to break away a skin or layer of oxide covering the molder solder cap 26. The skin of oxide, if it is not removed or broken away, prevents good wetting of the solder of the molten solder cap 26 on the bond pad 42. The deformation or squeezing out of the molten solder cap 26 in the inert environment 60, allows and promotes good wetting of the solder of the molten solder cap 26 on the bond pad 42, therefore flux may not be necessary (flux-less bonding process). One advantage of contacting the copper pillar 14 to the bond pad 42 with the molten solder cap 26 in liquid phase, is that where there are height variations among the plurality of bumps of the chip 12, and/or there are thickness variations among the plurality of bond pads 42, all the molten solder caps 26 of the plurality of bumps 20 would still be able to contact the bond pads 42. The solder masks 44 (FIG. 3) may be used to help prevent the molten solder cap 26 from bridging to an adjacent bond pad 42 (FIG. 3) when the molten solder cap 26 is deformed and squeezed out when the copper pillar 14 contacts the bond pad 42. After the contact between the pillar 14 and the bond pad 42 is detected, the bond-arm remains stationary for a predetermined amount of time (for example 1 second) to allow proper solder wetting of the molten solder cap 26 onto the bond pad 42.

FIG. 4C shows the chip 12 at a predetermined stand-off height above the substrate 40. After the contact between the pillar 14 and the bond pad 42 is detected and after the bond-arm remains stationary for the predetermined amount of time, the bond-arm moves up relative to or moves further away from the bond pad 42, from the first height to a second height. The second height is the predetermined stand-off height, distance, level, or position. The predetermined stand-off height may vary widely. One factor that may affect the predetermined stand-off height is the amount of solder in the unbonded solder cap 24. For example if the height of the unbonded solder cap 24 is 17 µm, the predetermined stand-off height may be approximately 2 µm to 14 µm away from the substrate 40 or the bond pad 42. The surface tension and the wetting of the molten solder cap 26 ensures that physical contact and good electrical conductivity of the solder are maintained between the pillar 14 and the bond pad 42, while the bond-arm moves from the first height to the second height, therefore a desirable stand-off height may be obtained. Moreover, raising the chip 12 to the predetermined stand-off height after contact between the pillar 14 and the bond pad 42 ensures that a height differential between the pillar 14 and the bond pad 42 is not affected by thermal expansion of the collet 30 or the substrate 40, as might be the case if the pillar 14 were to be moved directly to a certain stand-off height without reference to actual dimensions of the pillar 14 and the bond pad 42 respectively. Therefore, better stand-off height control is achieved.

The heater of the bond-arm is cooled down while the chip 12 is held by the collet 30 at the predetermined stand-off height. The chip 12 is kept at the second height while the chip 12 is cooled to a third temperature. The bond-arm stays at the predetermined stand-off height until the molten solder cap 26 cools down to the third temperature, which is below the melting point of the solder comprised in the molten solder cap 26, until the molten solder cap 26 solidifies to form the solder joint 22. The third temperature may vary widely, but is usually 20° C. to 30° C. below the melting point of the solder comprised in the molten solder cap 26. Thereafter, the collet 30 releases the chip 12, which is now bonded to the substrate 40, and the collet 30 moves either to the stand-by position or level, or to pick up another chip 12. When cooling down the bond-arm to the third temperature, the molten solder cap 26 solidifies to form the solder joint 22, at the predetermined stand-off height. Therefore, better stand-off height control is achieved. The third temperature may be similar to a stand-by temperature. An advantage of the third temperature being similar to the stand-by temperature, is that the bond-arm is at the appropriate temperature for the next bonding cycle, thus conserving time. Therefore, a higher throughput is achieved.

Alternatively, the collet 30 may release the chip 12, which is bonded to the substrate 40, without the bond-arm cooling down to the third temperature. After the collet 30 releases the chip 12, the molten solder cap 26 will come to rest at an equilibrium height and solidify to form the solder joint 22 as it cools.

Figure 5:
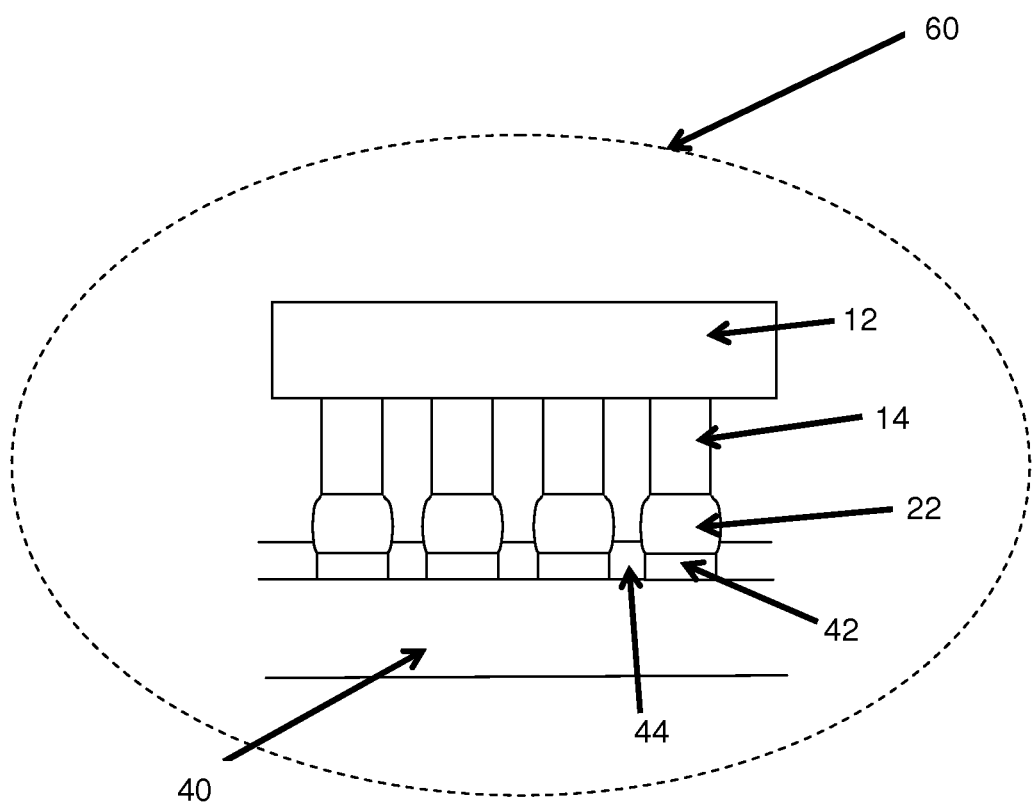
FIG. 5 shows the chip bonded to the substrate.

FIG. 5 shows the chip 12 bonded to the substrate 40. The first side of the chip 12 with the plurality of copper pillars 14 attached is facing the substrate 40. The plurality of copper pillars 14 are bonded, joint, or connected to the plurality of bond pads 42 by the solder joints 22. The chip 12 comprises the solder masks 44, where respective solder masks 44 are disposed or located between corresponding adjacent bond pads 42.

Figure 6:
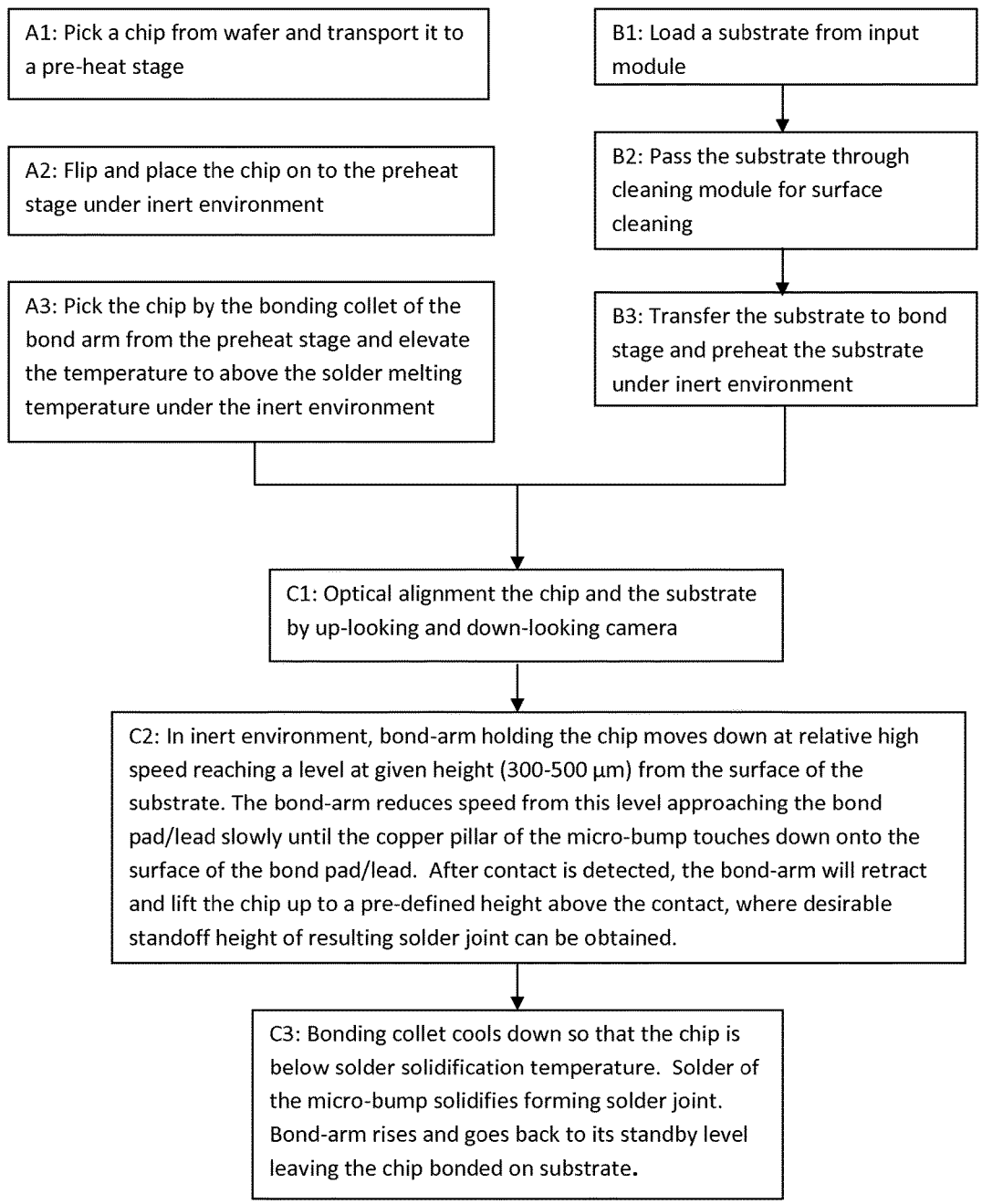
FIG. 6 shows a process flow of a preferred embodiment of a die bonding process.

FIG. 6 shows a process flow of a preferred embodiment of a die bonding process. The preferred embodiment of the die bonding process may be used in a high speed flip-chip bonding process, or to assemble fine-pitch and/or high density electronic packages. A1 to A3 relate to a chip preparation process before bonding, and B1 to B3 relate to a substrate preparation process before bonding. The chip preparation process of A1 to A3 and the substrate preparation process of B1 to B3 may proceed in parallel or simultaneously. In A1, a die or chip 12 is picked up by a chip detachment module from amongst a singulated silicon wafer on a wafer table. The chip 12 is transported to a first preheat stage by a chip transfer arm. In A2, the chip 12 is flipped and placed on a top plate of the first preheat stage. The chip 12 comprises a plurality of bumps 20, where each of the bumps 20 comprises a respective unbonded solder cap 24 attached to one end of a corresponding pillar 14. The chip 12 is preheated in an inert environment 60, on the first preheat stage to a first temperature, which is a temperature close to and below the melting point of the bumps 20 of the chip 12. While the chip 12 is preheated to the first temperature, the chip is also waiting to be picked up by the collet 30. In A3, the chip 12 is picked up by a collet 30 of a bond-arm. The bond-arm comprises a heater, and the chip 12 is heated in the inert environment 60, to a second temperature which is above the melting point of the bumps 20 of the chip 12, until the unbonded solder caps 24 of the bumps 20 are molten or in the liquid phase, forming molten solder caps 26. The inert environment 60 prevents further oxidization or re-oxidation of the solder in the bumps 20 of the chip 12.

The substrate preparation process of B1 to B3 may be performed or proceed simultaneously with the chip preparation process of A1 to A3. In B1, a substrate 40 is loaded from an input module (not shown) containing a plurality of substrates 40. In B2, the substrate 40 is transferred to a cleaning module (not shown) where the substrate 40 undergoes cleaning by for example a plasma cleaning process and/or an organic surface protection (OSP) removal process. The substrate 40 is cleaned by the cleaning module so that that the surfaces of bond pads 42 of the substrate 40 is sufficiently clean, in order to obtain high bonding yield for the die bonding process. If the surfaces of the bond pads 42 comprises copper/nickel/gold (Cu/Ni/Au) or if the underneath metallization is protected by a noble metal, the plasma cleaning process may be sufficient to clean the surfaces of the bond pads 42. If the surfaces of the bond pads 42 comprises copper with OSP (Cu/OSP), flux may be applied to the surface of the substrate 40, and the OSP may be removed at an elevated temperature. Then, in B3, the substrate 40 is transferred to a second preheat bond stage, where the substrate 40 is preheated in the inert environment 60. The inert environment 60 prevents oxidation or re-oxidation of the bond pads 42 of the substrate 40. The substrate is held onto the second preheat bond stage by vacuum suction and/or a mechanical clamping mechanism. One advantage of using vacuum suction and/or the mechanical clamping mechanism to hold the substrate is that any problems due to substrate warpage can be minimized, because the substrate 40 is held flat onto the second preheat bond stage.

C1 to C3 show the die bonding process for the chip 12, which is performed in the inert environment 60. In C1, optical alignment is performed by an optical alignment module to align the chip 12 and the substrate 40. The optical alignment module comprising an up-looking camera and a down-looking camera, is located vertically lower than the chip 12 held by the collet 30, and vertically higher than the substrate 40 on the second preheat bond stage. The optical alignment of the chip 12 is performed by the up-looking camera and the optical alignment of the substrate 40 is performed by the down-looking camera. The second preheat bond stage moves and adjust its position and orientation, so as to align the pillars 14 or the bumps 20 vertically above the bond pads 42. The positioning accuracy between the chip 12 and the substrate 40 may be kept to within 2 μm to 3 μm.

In C2, the bond collet 30 holding the chip 12 moves at a relatively high speed downwards to a predetermined contact detecting level or position, and then slows down in order to detect the contact between the copper pillars 14 and the bond pads 42 or leads (when solder joints 22 are to be made on bond leads). The inert gas of the inert environment 60 promotes the wetting of molten solder in the bumps 20 to the bond pad 42. After the copper pillars 14 on the chip 12 contacts the bond pad 42 on the substrate 40, the bond-arm retracts and lifts the chip 12 up to a predetermined stand-off height, level, or position, where a desirable stand-off height may be obtained. One advantage of contacting the copper pillar 14 to the bond pad 42 with the solder in the bumps 20 of the chip 12 in liquid phase, is that where there are height variations among the plurality of bumps 20 of the chip 12, and/or there are uneven thickness among the plurality of bond pads 42, the molten solder cap 26 of the bumps 20 would still be able to wet the bond pads 42.

In C3, the collet 30 cools down to a third temperature which is below the melting point of the bumps 20 of the chip 12. The planarization of the chip 12 bonded to the substrate 40 is controlled by the planarization of the tip/tilt adjustment mechanism of the bond-arm, because the collet 30 is holding the chip 12 when solder on the chip 12 solidifies. The tip/tilt of the bond-arm should be adjusted such that the planarization of the chip 12 is aligned with or parallel to the substrate 40 to within 2 μm per 10 mm length. After the solder on the chip 12 solidifies to form the solder joints 22, the collet 30 of the bond-arm releases the chip 12, which is now bonded to the substrate 40, and the collet 30 moves either to the stand-by position or level, or to pick up another chip 12.

An advantage of performing the die bonding process in the inert environment 60, is that there may not be a need for the flux dipping process, where the bond-arm does not have to cool down to the low temperature, hence the cycle time of the die bonding process is substantially reduced.

Although the present invention has been described in considerable detail with reference to certain embodiments, other embodiments are possible.

The pillar 14 may comprise a metal such as gold, or lead. Gold pillars do not oxidize or corrode and have excellent electrical and thermal conductivity. Gold pillars have high melting points and are not reflowed and can be used to provide high aspect ratio structures.

The solder comprised in the solder cap 24, 26 may be any appropriate solder material, for example a eutectic tin lead alloy or tin. The first temperature may vary widely, but is usually from 5° C. to 30° C. below the melting point of the solder comprised in the solder cap 24, 26. The second temperature may also vary widely, but is usually 2° C. to 30° C. above the melting point of the solder comprised in the solder cap 24, 26. The third temperature may further vary widely, but is usually 5° C. to 30° C. below the melting point of the solder comprised in the solder cap 24, 26.

Therefore, the spirit and scope of the appended claims should not be limited to the description of the embodiments contained herein.

The invention claimed is:

1. A method of bonding a die comprising solder bumps to a substrate comprising bond pads, the method comprising the steps of:
heating the die from a first temperature to a second temperature prior to the solder bumps contacting the bond pads, wherein each solder bump comprises a pillar positioned on the die and a solder cap located on an end of the pillar which is remote from the die, and wherein the first temperature is below the melting point of the solder caps, and the second temperature is above the melting point of the solder caps such that molten solder caps are formed;
moving the die including the molten solder caps relative to the substrate until the pillars exert a contact force on the bond pads at a first height and the molten solder caps are squeezed out around the pillars;
moving the die further away from the substrate to a second height, while maintaining contact between the solder caps and bond pads; and
thereafter cooling the die from the second temperature to a third temperature to allow the molten solder caps to solidify so as to bond the die to the substrate.

2. The method of claim 1 further comprising the step of:
allowing the solder bumps to wet the bond pads, while the die is at the first height and before moving the die to the second height.

3. The method of claim 1, wherein the third temperature is 5° C. to 30° C. below the melting point of the solder bumps.

4. The method of claim 1, wherein the step of cooling the die to the third temperature is conducted while keeping the die at the second height.

5. The method of claim 1 further comprising the step of:
heating the die to the first temperature on a preheat stage, before the step of heating the die from the first temperature to the second temperature.

6. The method of claim 5, further comprising the step of:
simultaneously heating the substrate while heating the die to the first temperature.

7. The method of claim 1 further comprising the step of:
heating the substrate, before the step of moving the die relative to the substrate to the first height.

8. The method of claim 7 further comprising the step of:
aligning the die relative to the substrate, such that each solder bump is vertically above a respective bond pad, after the steps of heating the substrate and heating the die from the first temperature to the second temperature, and prior to moving the die to the first height.

9. The method of claim 1 further comprising the steps of:
moving the die at a first speed towards the substrate; and after moving the die at the first speed, moving the die at a second speed towards the substrate, in order to search for contact between the pillars and the bond pads;
wherein the first speed is higher than the second speed.

10. The method of claim 1, wherein the step of moving the die relative to the substrate to the first height, comprises the step of:
deforming the solder caps which are in liquid phase around the pillars.

11. The method of claim 1, wherein the step of moving the die relative to the substrate to the first height, is operative to deform the solder caps so as to break a respective skin of an oxide covering each solder cap.

12. The method of claim 1, wherein the substrate comprises respective barrier masks between corresponding adjacent bond pads.

13. The method of claim 1, wherein the first temperature is 5° C. to 30° C. below the melting point of the solder bump.

14. The method of claim 1, wherein the second temperature is 2° C. to 30° C. above the melting point of the solder bump.

15. The method of claim 1, wherein the method is performed in an inert gas environment.

16. The method of claim 15, wherein the inert gas environment comprises an oxygen level below 50 parts per million.

17. The method of claim 15, further comprising the step of actively introducing nitrogen gas to form the inert gas environment.

\* \* \* \* \*